United States Patent [19]

Spakman

[11] 4,141,254
[45] Feb. 27, 1979

[54] PUSHBUTTON RESELECTION TUNER WITH PIVOTING LEVER

[75] Inventor: Geert Spakman, Eindhoven, Netherlands

[73] Assignee: U.S. Philips Corporation, New York, N.Y.

[21] Appl. No.: 795,878

[22] Filed: May 11, 1977

[30] Foreign Application Priority Data

May 13, 1976 [NL] Netherlands ............... 7605095

[51] Int. Cl.² ............................................. F16H 35/18
[52] U.S. Cl. ................................. 74/10.33; 74/10.35; 74/10.37; 74/10.39; 74/10.6; 74/10.9
[58] Field of Search ............... 74/10.33, 10.35, 10.37, 74/10.39, 10.6, 10.9; 334/7

[56] References Cited

U.S. PATENT DOCUMENTS

| Re. 22,634 | 4/1945 | Plensler | 74/10.33 |
|---|---|---|---|
| 2,232,217 | 2/1941 | Dijksterhuis | 74/10.39 |
| 2,251,476 | 8/1941 | Winchell | 74/10.33 |
| 2,266,710 | 12/1941 | Plensler | 74/10.33 |
| 2,339,177 | 1/1944 | Leishman | 74/10.37 |
| 2,342,691 | 2/1944 | Plensler | 74/10.33 |
| 2,429,406 | 10/1947 | Dunn | 74/10.37 |
| 2,857,519 | 10/1958 | Gaskill | 74/10.27 |
| 3,177,729 | 4/1965 | Clark | 74/10.33 |

FOREIGN PATENT DOCUMENTS 61687  12/1943  Denmark ............................... 74/10.33

Primary Examiner—Samuel Scott
Assistant Examiner—R. C. Turner
Attorney, Agent, or Firm—David R. Treacy

[57] ABSTRACT

A pushbutton preselection tuner in which pushbuttons cooperate in different locations with a pivotable lever coupled to a slide which in turn is coupled to the tuning means. Continuous tuning is provided by driving the slide itself. This tuner has a compact, flat shape which can easily also accommodate cassette apparatus.

9 Claims, 4 Drawing Figures

PUSHBUTTON RESELECTION TUNER WITH PIVOTING LEVER

BACKGROUND OF THE INVENTION

The invention relates to a tuner having a number of pushbutton rods slidable parallel to each other which correspond to preselected stations, the rods co-operating in various locations with a lever which waves in a plane parallel to the plane of the pushbutton rods and is pivotable against spring force, the pivotable lever being coupled to tuning means which are slidable parallel to the direction of movement of the pushbutton rods.

In a tuner of the described kind known from U.S. Pat. No. 2,522,973, the pivotable lever is connected, by a connection rod, to a transverse lever which is coupled to the tuning means. The connection rod is pivotably connected approximately in the center of the pivotable lever and the transverse lever. Because the electrical section occupies, viewed in the width direction of the tuner, a substantial part of the overall width of the tuner, the transverse lever also occupies a large part of the width of the tuner. This arrangement of the mechanical and the electrical section of the known tuner relative to each other makes it difficult to accomodate a mechanism for continuous tuning, required in contemporary tuners, in the available space. The continued miniaturisation of electrical components has resulted in a reduction of the width of the electrical section, but cannot be optimally utilized in the known construction, because insufficient space can be gained on either side of the electrical section.

The known tuner, having centrally arranged mechanical and electrical tuning means, also prevents integration of a cassette apparatus with the tuner in a comparatively flat construction.

SUMMARY OF THE INVENTION

The object of the invention is to provide a tuner which is compact and provides room for additional functions such as cassette players.

In accordance with the invention the pivotable lever of a tuner is coupled, near a free end, to a slide which is slidable parallel to the direction of movement of the pushbutton rods, and the tuning means is connected to the slide which engages, in the neutral position of the pushbutton rods, a drive for continuous adjustment of the tuning means, the slide disengaging from the drive when a pushbutton rod for preselection stations is depressed.

Because the tuning means for tuning the preselected stations as well as for the continuous tuning to arbitrary stations are coupled to the pivotable lever so that a roughly L-shaped arrangement is obtained, the space behind the pivotable lever remains available to accommodate other electronics and also a part of a cassette apparatus. The slide used for coupling the pivotable lever to the tuning means thus offers an excellent possibility of continuous adjustment of the tuning means.

In a preferred embodiment of the tuner in accordance with the invention, enabling a simple and reliable drive for continuous tuning, the slide is provided with teeth which cooperate with teeth on a drive shaft which is rotatable about its longitudinal axis and also pivotable about an axis which extends transversely of this longitudinal axis.

In a further preferred embodiment of a tuner in accordance with the invention the teeth on the slide consist of a rack, and the teeth on the drive shaft are formed by a worm.

The invention will be described in detail hereinafter with reference to a preferred embodiment shown in the drawing;

DESCRIPTION OF THE PREFERRED EMBOIDMENT

Figure 1:
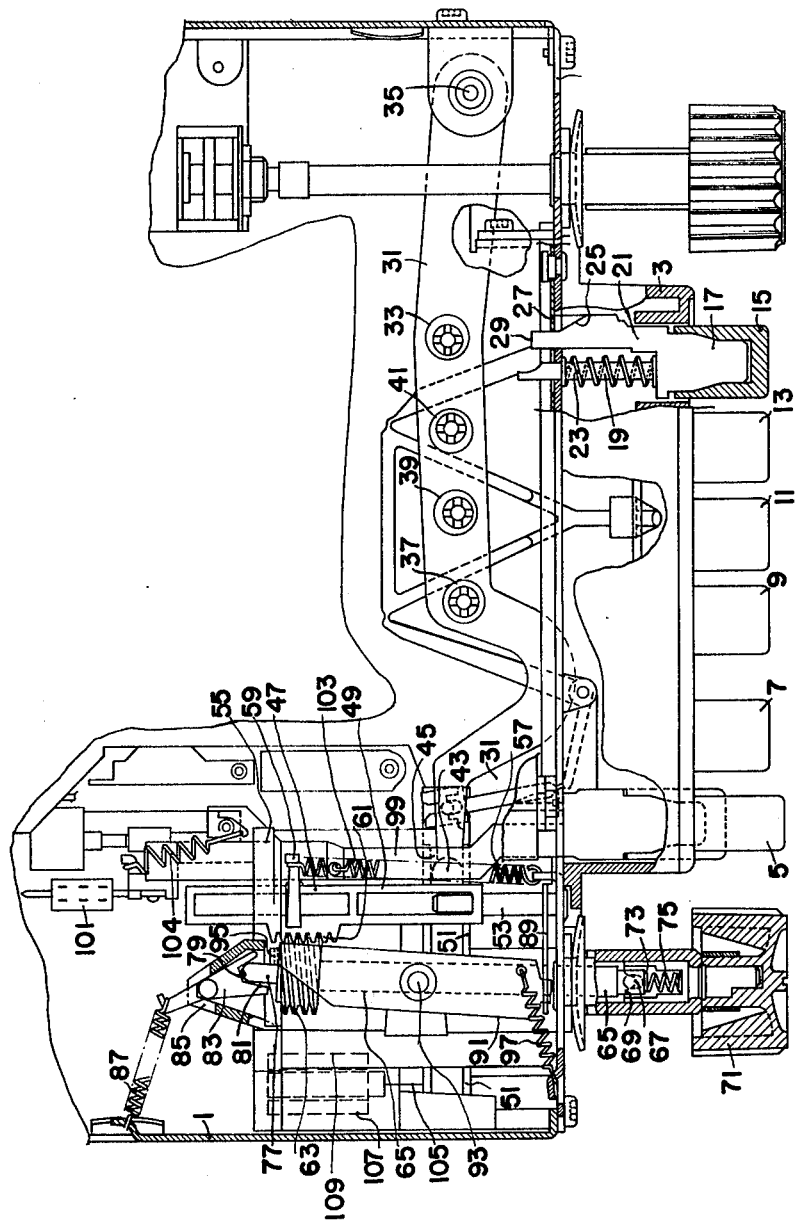
FIG. 1 is a plan view, partly in section, of a tuner in accordance with the invention.

The tuner shown in FIG. 1 comprises a frame 1 of sheet metal which is provided on its front side with a bearing 3 for guiding a number of pushbuttons 5, 7, 9, 11, 13 and 15. The pushbuttons (see button 15) are each secured on a respective forked pushbutton rod 17, having legs 19 and 21. Around the leg 19 of the pushbutton rod 17 a helical spring 23 bears against the front of the frane 1. The leg 21 has an inclined edge 25 for sliding a strip-shaped latch 27, against spring force, in a direction transverse to the direction of movement of the pushbutton. The assembly formed by the pushbutton 15 and the pushbutton rod 17 is journalled on the one side, by way of the pushbutton 15, in the bearing 3 and on the other side in the frame 1 by way of the legs 19 and 21. The pushbutton rods of the pushbuttons 9, 11, 13 and 15 are identical.

When the pushbutton 15 is depressed, the end face 29 of the leg 21 abuts an eccentric 33 provided on a pivotable lever 31. The pivotable lever 31, made of strip metal, is rotable against spring force about a shaft 35 which is journalled in the frame 1. The pushbuttons 9, 11 and 13 cooperate with eccentrics 37, 39 and 41 which are also mounted on the pivotable lever. The identical eccentrics 33, 37, 39 and 41 (see FIG. 3) are rotatable with substantial friction, relative to the pivotable lever 31, about axes which are perpendicular to the plane of the pivotable lever. Because each pushbutton corresponds to a given preselection station, each eccentric also corresponds to a given preselection station. Because the pushbuttons 9, 11, 13 and 15 all have the same stroke but engage the eccentrics at a different distance from the shaft 35, the deflection of the free end of the pivotable lever 31 differs for the various pushbuttons.

The eccentrics are arranged at a different distance from the front of the tuner, viewed in the displacement direction of the pushbuttons. The effective stroke of the pushbuttons, therefore, differs. The deflection of the free end of the pivotable lever is thus maintained within given limits. The so-called frequency-sensitive stations, that is, stations which are situated in a steep part of the tuner-frequency characteristic, are assigned as much as possible to pushbuttons having a comparatively large effective stroke. The rotatable eccentrics 33, 37, 39 and 41 serve for the fine adjustment of the angular shifts to be performed by the pivotable lever 31.

The end of the pivotable lever 31 which is remote from the shaft 35 has a rounded portion 43 which can slide and rotate in a guide groove 45 of a slide 47. The slide 47 has two legs 49 and 51 which extend perpendicular to each other, the leg 49 being guided at its front on a rod 53 secured to the frame and extending rearwardly parallel to the pushbutton rods, and at its rear in a transverse wall 55 of the frame 1. The remote end of the leg 51 is guided in the left side wall of the frame 1. The guide groove 45 is formed in an extension of the leg 51 opposite the remote end. The slide 47 can be slid along the rod 53 to the rear against the force of a helical spring 57 having one end hooked into the frame 1, and the other end hooked onto a projection 59 of the slide 47.

The leg 49 of the slide 47 has a toothed rack 61 which can be made to engage a worm 63 provided on a drive shaft 65. Near one end, the drive shaft 65 is provided with two projections 67, one on each side of the shaft in line with each other, the projections extending transversely of the longitudinal direction of the shaft. The projections 67 engage a transverse slotted recess 69 in a rotary knob 71 for continuous adjustment of the tuning means. The end 73 of the drive shaft 65 which extends beyond the projections 67 bears on a helical thrust spring 75 which is located in the drive knob 71. On its rear end 77 remote from the end 73, the drive shaft 65 comprises a rounded portion 79 which bears in a cup 81 of a rodring lever 83. The rodring lever 83 is pivoted in a bearing cup 85 which forms part of the frame. The pivotable lever 83 is biased by a helical spring 87 connected to the frame, so as to urge the end 77 toward, and the worm 63 against, the rack 61. The latch 27 comprises a prolongation 89 which is coupled to a control lever 91. The lever 91 extends generally parallel to the drive shaft 65, and is pivoted near its center about a shaft 93 secured in the frame. Near its end which is remote from the extension 89, the control lever 91 comprises a catch 95 which engages behind the end 77 of the drive shaft 65. The control lever 91 is biased by a helical spring 97 which pulls the lever 91 in a direction to urge the latch 27 to the left.

The pushbuttons 5 and 7 are not intended for tuning to a preselection station — like the push-buttons 9, 11, 13 and 15 - but serve for the continuous tuning to an arbitrary station in the medium or the long wave range. The button 5 is separately coupled by a long leg 99 to a wave range switch 101 which comprises a first or neutral position which corresponds to the long wave range in which all preselection stations are situated, and a second position which corresponds to the medium wave range. Depression of the button 5 causes the switch to change over to the medium wave position against the force of a helical spring 104. When one of the preselection buttons is depressed, movement of the latch 27 to the right allows the button 5 to return to the non-depressed position, so that the switch 101 returns to the long wave position.

The electrical tuning means are formed by a commonly used core/coil combination and are not shown in detail in the drawing. Rigid metal wires 105 are connected to the leg 51 of the slide 47, the other end of the wires being connected to tuning cores 109 which are slidable in the coils 107. A core/coil combination corresponds to each of the pushbuttons 9, 11, 13 and 15. The pushbutton 7 for continuous tuning to the long wave does not cooperate (like the button 5) with the pivotable arm 31.

The operation of the tuner will be described in detail hereinafter. When, for example, the preselection button 15 is depressed, the leg 21 of the pushbutton rod 17 abuts against the eccentric 33 on the pivotable lever 31 and causes an angular shift of the pivotable lever which corresponds to the preselection station associated with the pushbutton 15. The pushbutton 15 is locked in its depressed position by the latch 27 which has been shifted to the right during depression. The shift to the right of the latch 27 causes counter-clockwise rotation of the lever 91 about the shaft 93, with the result that the catch 95 disengages the worm 63 from the toothed rack 61. The drive shaft 65 is then deflected to the left about the pivot formed by the projections 67 and the slot 69. The movements of the latch 27 and the pivotable lever 31 are attuned to each other so that the pivotable lever 31 starts to drive the slide 47 just after the worm 63 disengages from the toothed rack 61. After having passed a central position, the drive shaft 65 is accelerated to its uncoupled position. The central position of the drive shaft 65 is formed by the connecting line between the pivot of the pivotable lever 83 and the pivot of the drive shaft in the rotary knob 71. The spring 75, compressed during the deflection of the drive shaft 65, contributes to fast movement of the drive shaft to its uncoupled position. The slide 47 can then be slid by the pivotable lever 31 (indirectly by the button 15) until the core 109 is in the correct position in the coil 107 which corresponds to the desired preselection station. The wave range switch 101 is in its neutral position, i.e. the position corresponding to the long wave range.

Figure 2:
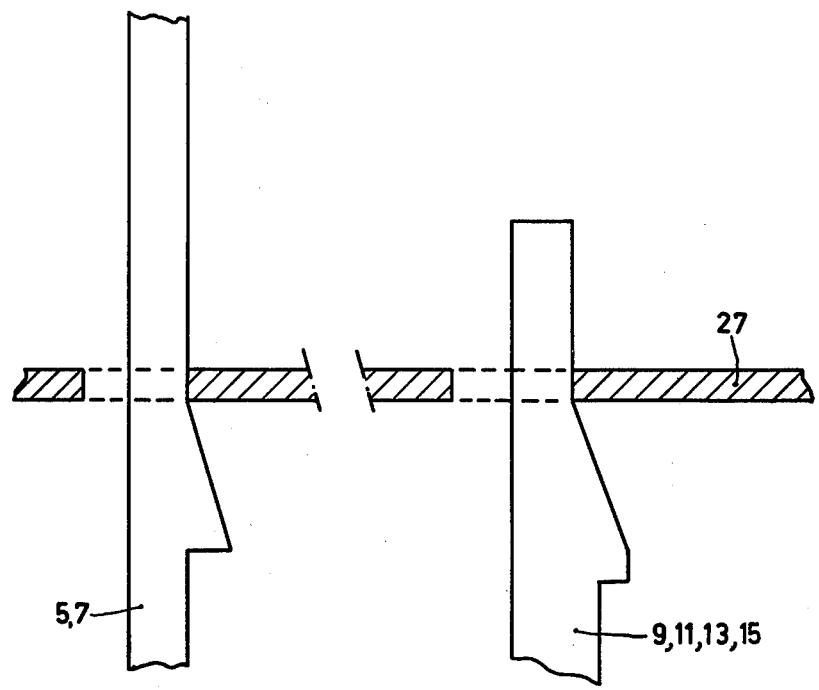
FIG. 2 is a detailed, diagrammatic sectional view of a latch used in the tuner shown in FIG. 1.

Because all buttons release each other by way of the latch 27, the button 15 may be returned to its neutral position by depression of, for example, the button 5. Simultaneously with the depression of the button 5, the switch 101 is set, via the leg 99, to the medium wave position against the force of the spring 104. The pushbutton rods of the pushbuttons 5 and 7 have a profile for cooperation with the latch 27 so that the movement to the right of the latch is sufficient to release the preselection buttons, but insufficient to deflect the drive shaft 65, coupled to the latch, beyond its central position. Because, moreover, the locked, depressed position of the buttons 5 and 7 corresponds to the neutral position of the latch, the worm 63, after initial uncoupling upon depression of the buttons 5 and 7, directly engages the toothed rack 61 again. The described pushbutton rod profile is diagrammatically shown in FIG. 2.

When the button 5 is depressed, tuning to any arbitrary station in the medium wave range can be realized by rotation of the continuous tuning knob 71. To this end, the slide 47 is coupled to a number of core/coil combinations (only the combination 107, 109 is shown) for the medium wave range. Similarly, when the button 7 is depressed, tuning to any station in the long wave range can be realized by rotation of the knob 71. However, the button 7 is not coupled to the wave range switch 101, because it already occupies the neutral position corresponding to the long wave range when the button 5 is not depressed.

Figures 3, 4:
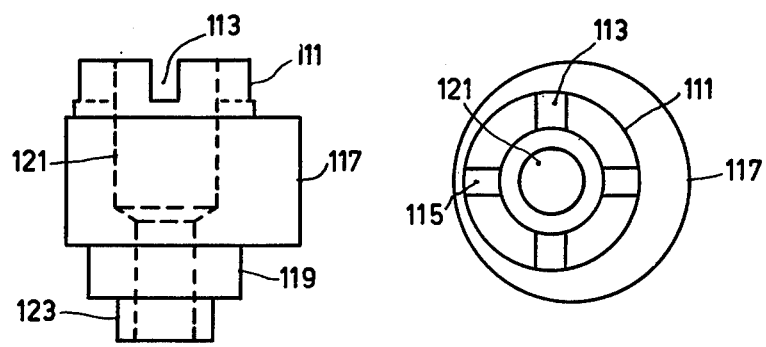
FIGS. 3 and 4 are a detailed sectional view and a plan view, respectively, of an eccentric used in the tuner shown in FIG. 1.

The eccentrics 33, 37, 39 and 41 which are shown in the FIG. 3 and 4 and which are mounted on the pivotable lever 31 are identical.

Each eccentric comprises a head 111 which is provided with two slots 113 and 115 which extend transversely of each other. The head 111 is adjoined by an eccentric disc 117, the circumference of which cooperates with the ends 29 of the legs 21 of the button rods 9, 11, 13 and 15. In the assembled condition, the disc 117 serves as a shoulder for supporting the eccentric on the pivotable lever 31. The eccentric disc 117 is adjoined by a centric portion 119 which fits in a bore (not shown) in the pivotable lever 31. The eccentric also has a bottomless bore 121 which leaves such a wall thickness of a narrowed end portion 123 of the eccentric that this end portion can be readily flanged over. When the end portion 123 is flanged over against the pivotable lever 31 — preferably with insertion of a spring washer, for example, a cupped spring washer, a clamping force is obtained which is adequate to prevent rotation of the eccentric relative to the pivotable lever in normal operating conditions. The (fine) tuning to a preselection station is effected by first depressing and locking the relevant pushbutton rod, followed by adjustment of the eccentric by means of a screw-driver. For bulk manufacture, use can be made of a quadruple screwing head which is controlled by a computer. The adjustment of the eccentrics can thus be quickly and automatically performed.

Even though the described preferred embodiment of the tuner in accordance with the invention utilizes a control lever 91 for uncoupling the drive shaft 65, use can alternatively be made of a direct coupling between the latch 27 and the drive shaft 65. The toothed rack 61 is then preferably situated at the front of the apparatus, and the uncoupling latch does not move to the right but to the left. This can be realized by arranging the profiles 25 on the other side of the legs 21.

What is claimed is:

1. A pushbutton preselection tuning mechanism, comprising a frame, a plurality of pushbutton rods journalled in the frame for sliding movement in a given direction parallel to each other, each rod corresponding to a preselected station; a lever disposed in a plane parallel to the direction of movement of the pushbutton rods, and pivotally connected to the frame for movement about a fixed axis against a spring force; means for pivoting said lever to a given position corresponding to the preselected station upon depression of a pushbutton rod; tuning means; and means for coupling the tuning means to the lever for sliding movement parallel to said given direction, wherein the improvement comprises:
 a slide mounted to the frame for movement parallel to said given direction and coupled to the lever near a free end of the lever,
 a continuous adjustment for the tuning means,
 means, responsive to the pushbutton rods being in a neutral position, for connecting the slide to said continuous adjustment drive, and
 means for disconnecting the slide from the continuous adjustment drive upon depression of a pushbutton rod;
 and wherein the means for coupling the tuning means to the lever comprise means connecting the tuning means to the slide.

2. A mechanism as claimed in claim 1, wherein said continuous adjustment drive includes a shaft rotatable about a longitudinal axis, pivotally mounted to the frame about an axis transverse to the longitudinal axis, and having a helical tooth about the shaft circumference; and at least one tooth on said slide arranged facing said helical tooth; and
 wherein said means for connecting the slide comprises means for biasing the shaft to pivot so that said teeth engage.

3. A mechanism as claimed in claim 2, wherein said at least one tooth is a rack; and said helical tooth is a worm gear.

4. A mechanism as claimed in claim 2, wherein said means for disconnecting the slide includes a latch arranged to be engaged by said pushbutton rods for sliding movement in a releasing direction transverse to said given direction responsive to depression of one of said pushbutton rods, and means for coupling the latch to the shaft to pivot the helical tooth out of engagement.

5. A mechanism as claimed in claim 4, wherein said means for coupling the latch includes a control lever having a front end arranged for engagement by the latch and a rear end arranged to engage the shaft at a location remote from the shaft first end, the control lever being pivotable about an axis intermediate the lever ends, such that upon movement of the latch in said releasing direction the control lever pivots and moves the shaft helical tooth out of engagement with said at least one tooth.

6. A mechanism as claimed in claim 4, comprising at least one further pushbutton for selecting continuous adjustment of the tuning means, arranged such that upon depression of said further pushbutton the latch engages the further pushbutton to hold it in the depressed condition, and on depression of one of said pushbutton rods movement of the latch in the releasing direction releases said further pushbutton.

7. A pushbutton preselection tuning mechanism, comprising a frame, a plurality of pushbutton rods journalled in the frame for sliding movement in a given direction parallel to each other, each rod corresponding to a preselected station; a lever disposed in a plane parallel to the direction of movement of the pushbutton rods, and pivotally connected to the frame for movement about a fixed axis against a spring force; means for pivoting said lever to a given position corresponding to the preselected station upon depression of a pushbutton rod; tuning means; and means for coupling the tuning means to the lever for sliding movement parallel to said given direction, wherein the improvement comprises:
 a slide mounted to the frame for movement parallel to said given direction and coupled to the lever near a free end of the lever, having at least one tooth projecting in a direction transverse to said given direction,
 a continuous adjustment drive for the tuning means, comprising a shaft rotatable about a longitudinal axis, having a helical tooth about the shaft circumference facing said at least one tooth, and pivotally mounted to the frame about an axis adjacent a first end of the shaft transverse to the longitudinal axis and remote from said helical tooth; a first spring arranged to bias the shaft first end in a direction parallel to said given direction toward the helical tooth, a member having bearing means for positioning the second end of the shaft and arranged for movement of the bearing means transverse to said given direction, and a second spring for biasing said member in a transverse direction so as to urge the helical tooth toward said at least one tooth, and
 means for disconnecting the slide from said continuous adjustment drive, responsive to depression of a pushbutton rod, comprising a latch arranged to be engaged by said pushbutton rods for sliding movement in a releasing direction transverse to said given direction in response to depression of one of said push-button rods, and means for coupling the latch to the shaft to pivot the helical tooth out of engagement,
 and the means for coupling the tuning means to the lever comprise means connecting the tuning means to the slide.

8. A mechanism as claimed in claim 7 comprising an adjustment knob mounted to the frame for rotation about an axis parallel to said given direction and having a transverse recess at a rear end of a knob, wherein said shaft has a transverse projection adjacent said first end engaging said recess.

9. A mechanism as claimed in claim 7, wherein said member is a rocking lever having a cup-shaped cavity in which the shaft second end bears, the rocking lever being pivotal in a cupped bearing rigidly arranged with respect to the frame.

* * * * *